(12) United States Patent
Ukumori et al.

(10) Patent No.: US 11,237,214 B2
(45) Date of Patent: Feb. 1, 2022

(54) ESTIMATION DEVICE, ENERGY STORAGE APPARATUS, ESTIMATION METHOD, AND COMPUTER PROGRAM

(71) Applicant: GS Yuasa International Ltd., Kyoto (JP)

(72) Inventors: Nan Ukumori, Kyoto (JP); Katsuya Inoue, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 50 days.

(21) Appl. No.: 16/631,614

(22) PCT Filed: Jul. 19, 2018

(86) PCT No.: PCT/JP2018/026994
§ 371 (c)(1),
(2) Date: Jan. 16, 2020

(87) PCT Pub. No.: WO2019/017411
PCT Pub. Date: Jan. 24, 2019

(65) Prior Publication Data
US 2020/0182938 A1   Jun. 11, 2020

(30) Foreign Application Priority Data

Jul. 19, 2017  (JP) .............................. JP2017-140257
Jul. 13, 2018  (JP) .............................. JP2018-133649

(51) Int. Cl.
*G01R 31/367*   (2019.01)
*G01R 31/382*   (2019.01)
*H01M 10/48*    (2006.01)

(52) U.S. Cl.
CPC ......... *G01R 31/367* (2019.01); *G01R 31/382* (2019.01); *H01M 10/48* (2013.01)

(58) Field of Classification Search
None
See application file for complete search history.

(56) References Cited

U.S. PATENT DOCUMENTS

2012/0105068 A1   5/2012  Wang et al.
2013/0099794 A1   4/2013  Takahashi et al.
(Continued)

FOREIGN PATENT DOCUMENTS

EP    3 605 122 A1    2/2020
EP    3 605 125 A1    2/2020
(Continued)

OTHER PUBLICATIONS

Natthawuth Somakettarin, Hideharu Sugihara, Tsuyoshi Funaki, Open-circuit-voltage characterization system design for studies of phase-transition mechanism and deterioration in Mn-type Li-ion batteries, IEICE Electronics Express, 2017, vol. 14, Issue 15, pp. 20170690 (Year: 2017).*

(Continued)

*Primary Examiner* — Roy Y Yi
(74) *Attorney, Agent, or Firm* — McGinn IP Law Group, PLLC

(57) ABSTRACT

An estimation device include: an acquisition unit that acquires information relating to a part of a third characteristic that is an energy storage amount-voltage charge characteristic and/or a fourth characteristic that is an energy storage amount-voltage discharge characteristic, of an energy storage device; a storage unit that stores a plurality of energy storage amount characteristics that are at least any of first characteristics, second characteristics, third characteristics that are energy storage amount-voltage charge characteristics, fourth characteristics that are energy storage amount-voltage discharge characteristics, and pieces of V–dQ/dV in correspondence with a change in a feature value, which is changed by repeated charge-discharge, or (Continued)

stores as a function of the feature value; and a first estimation unit that estimates an internal state of the energy storage device on the basis of the information and the energy storage amount characteristics.

20 Claims, 10 Drawing Sheets

(56) References Cited

U.S. PATENT DOCUMENTS

2015/0147614 A1    5/2015  Wang et al.
2017/0033572 A1*   2/2017  Becker ................. G01R 31/367

FOREIGN PATENT DOCUMENTS

| JP | 2011-220917 A | 11/2011 |
| WO | WO 2014/045706 A1 | 3/2014 |
| WO | WO 2017/098686 A1 | 6/2017 |

OTHER PUBLICATIONS

International Search Report (ISR) (PCT Form PCT/ISA/210), in PCT/JP2018/026994, dated Sep. 25, 2018.
Extended European Search Report dated May 6, 2020 for European Patent Application No. 18834355.2-1010.

* cited by examiner

ESTIMATION DEVICE, ENERGY STORAGE APPARATUS, ESTIMATION METHOD, AND COMPUTER PROGRAM

TECHNICAL FIELD

The present invention relates to an estimation device, an energy storage apparatus including the estimation device, an internal state estimation method, and a computer program.

BACKGROUND ART

For vehicle secondary batteries used in electric vehicles, hybrid vehicles, and the like, and industrial secondary batteries used in power storing apparatuses, solar power generating systems, and the like, a higher capacity is required. Various studies and improvements have been made so far, and realization of a higher capacity by only improving an electrode structure and the like tends to be difficult. Therefore, development of positive electrode materials having a higher capacity than current materials is underway.

Conventionally, lithium transition metal composite oxide with $\alpha$-NaFeO$_2$ type crystal structure has been studied as a positive active material for a nonaqueous electrolyte secondary battery such as a lithium ion secondary battery, and a nonaqueous electrolyte secondary battery using LiCoO$_2$ has been widely put into practical use. A discharge capacity of LiCoO$_2$ has been about 120 to 130 mAh/g.

When the lithium transition metal composite oxide is represented by LiMeO$_2$ (Me is a transition metal), it has been desired to use Mn as Me. In a case where Mn is contained as Me, a structure changes to a spinel type at a time of charge when a molar ratio of Mn in Me, Mn/Me, exceeds 0.5, and the crystal structure cannot be maintained. Therefore, charge-discharge cycle performance is extremely inferior.

Various LiMeO$_2$ type active materials in which the molar ratio of Mn in Me, Mn/Me, is 0.5 or smaller while a molar ratio of Li to Me, Li/Me, is approximately 1, have been proposed and put to practical use. A positive active material containing LiNi$_{1/2}$Mn$_{1/2}$O$_2$, LiNi$_{1/3}$Co$_{1/3}$Mn$_{1/3}$O$_2$, and the like, which are lithium transition metal composite oxides, has a discharge capacity of 150 to 180 mAh/g.

With respect to the LiMeO$_2$ type active material, there is also known a so-called lithium-rich active material that contains lithium transition metal composite oxide in which the molar ratio of Mn in Me, Mn/Me, exceeds 0.5 while a composition ratio of Li to a ratio of transition metal (Me), Li/Me, is greater than 1.

As the above-described high-capacity positive electrode material, a lithium-rich Li$_2$MnO$_3$-based active material has been studied. This material has a property called hysteresis that causes, for an identical state of charge (SOC), differences in voltage and electrochemical characteristics between individual SOC-open circuit voltage (OCV) at a time of charge and discharge.

In a case of having hysteresis, since the voltage is not uniquely determined with respect to SOC, it is difficult to estimate the SOC by an OCV method that estimates SOC on the basis of SOC-OCV. Since the SOC-OCV curve is not uniquely determined, it is also difficult to predict dischargeable energy at a certain point.

The lithium-rich material has a property called voltage fade (hereinafter referred to as VF) in which an SOC-open circuit potential (OCP) curve of a positive electrode is changed over substantially the entire region by repeated charge-discharge. Since a value of an average discharge potential decreases, it is necessary to estimate not only a dischargeable capacity but also dischargeable watt-hour as a state of health (SOH) at the present moment. Even if the most recent charge-discharge history is identical, the SOC-OCV curve shape of a battery cell (hereinafter also simply referred to as "cell") based on a SOC-OCP curve of a single electrode changes significantly due to deterioration. Therefore, the OCV method cannot be adopted. Examples of the condition in which the most recent charge-discharge history is identical include, for example, charge after passing through a fully discharged state. In charge after passing through the fully discharged state, the SOC-OCP curve of the single electrode changes in accordance with deterioration. Therefore, the SOC-OCV curve shape of the cell changes significantly.

In a case where SOC is estimated by a current integration method that integrates and determines a charge-discharge current of a secondary battery, a measurement error of a current sensor accumulates when current integration is continued for a long period of time. Further, the battery capacity decreases with time. Therefore, an estimation error of the SOC estimated by the current integration method increases with time. Conventionally, when current integration is continued for a long period of time, the SOC is estimated by the OCV method, and OCV reset is performed to reset error accumulation.

Also in an energy storage device using an electrode material having VF and hysteresis, an error accumulates when current integration is continued. However, since the voltage is not uniquely determined with respect to SOC, it is difficult to perform the OCV reset.

Further, since SOC-OCV of the energy storage device also changes depending on a state of a counter electrode, it is necessary to estimate an internal state of the energy storage device also including the state of the counter electrode, in order to control the energy storage device.

That is, it is necessary to estimate SOC-OCP characteristics of the positive electrode at a time of current full charge and full discharge, a charge state (ratio of SOC-OCP of the positive electrode), a degree of positive electrode contraction, a degree of negative electrode contraction, a deviation amount in capacity balance between the positive and negative electrodes, and a parameter such as polarization. Then, it is necessary to estimate the SOC precisely.

It is difficult for current techniques for estimating SOH and SOC of nonaqueous electrolyte secondary batteries, to manage an active material having VF and hysteresis properties.

A measuring unit of the degradation determination device disclosed in Patent Document 1 measures an open-circuit voltage characteristic indicating an open-circuit voltage variation with respect to a lithium ion secondary battery capacity variation. A determining unit can set a parameter for identifying the open-circuit voltage characteristic, and determines a deterioration state due to wear and precipitation of lithium, by using a parameter for identifying the open-circuit voltage characteristic that substantially coincides with the open-circuit voltage characteristic measured by the measuring unit.

PRIOR ART DOCUMENT

Patent Document

Patent Document 1: JP-A-2011-220917

SUMMARY OF THE INVENTION

Problems to be Solved by the Invention

The degradation determination device of Patent Document 1 is to determine a deterioration state due to wear and precipitation of lithium, and cannot estimate an internal state of an energy storage device containing an active material that causes VF.

An object of the present invention is to provide an estimation device that can estimate an internal state of an energy storage device having a single electrode in which energy storage amount-potential characteristics are changed by repeated charge-discharge, an energy storage apparatus including the estimation device, an internal state estimation method, and a computer program.

Here, the energy storage amount means SOC, an energy dischargeable amount, and the like.

Means for Solving the Problems

An estimation device according to the present invention estimates an internal state of an energy storage device having a single electrode containing an active material in which repeated charge-discharge changes a first characteristic that is an energy storage amount-potential charge characteristic, and a second characteristic that is an energy storage amount-potential discharge characteristic. The estimation device includes: an acquisition unit that acquires information relating to a part of a third characteristic that is an energy storage amount-voltage charge characteristic and a fourth characteristic that is an energy storage amount-voltage discharge characteristic of the energy storage device; a storage unit that stores a plurality of energy storage amount characteristics that are at least any of first characteristics, second characteristics, third characteristics, fourth characteristics, and pieces of V–dQ/dV in correspondence with a change in a feature value, which is changed by repeated charge-discharge, or stores as a function of the feature value; and a first estimation unit that estimates an internal state of the energy storage device on the basis of the information, and the energy storage amount characteristics or the function.

Advantages of the Invention

With the above configuration, it is possible to satisfactorily estimate an internal state of the energy storage device having the single electrode in which energy storage amount-potential characteristics are changed by repeated charge-discharge.

MODE FOR CARRYING OUT THE INVENTION

Summary of Embodiments

Figure 1:
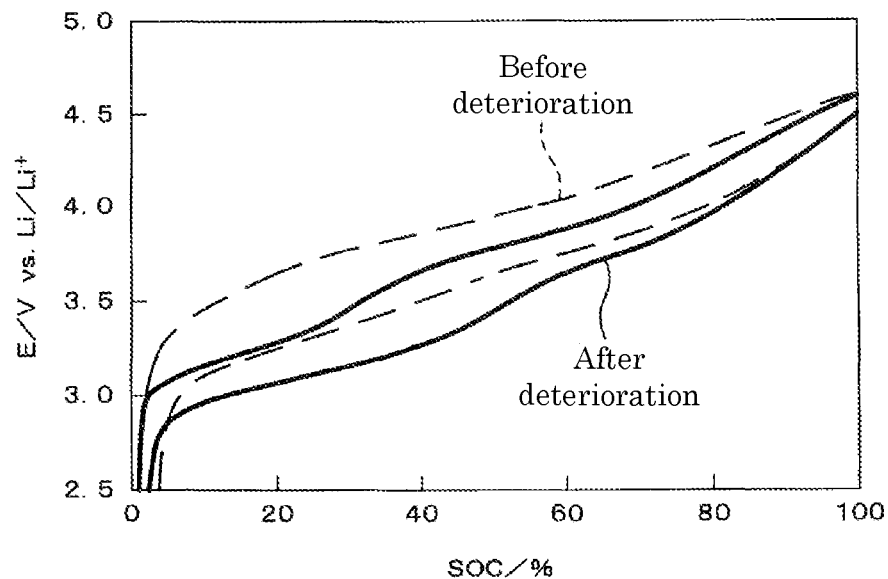
FIG. 1 is a graph showing an example of SOC-OCP of a positive electrode.

An estimation device according to an embodiment estimates an internal state of an energy storage device having a single electrode containing an active material in which repeated charge-discharge changes a first characteristic that is an energy storage amount-potential charge characteristic, and a second characteristic that is an energy storage amount-potential discharge characteristic. The estimation device includes: an acquisition unit that acquires information relating to a part of a third characteristic that is an energy storage amount-voltage charge characteristic and/or a fourth characteristic that is an energy storage amount-voltage discharge characteristic of the energy storage device; a storage unit that stores a plurality of energy storage amount characteristics that are at least any of first characteristics, second characteristics, third characteristics, fourth characteristics, and pieces of V–dQ/dV in correspondence with a change in a feature value, which is changed by repeated charge-discharge, or stores as a function of the feature value; and a first estimation unit that estimates an internal state of the energy storage device on the basis of the information, and on the basis of the energy storage amount characteristics or the function.

Here, V–dQ/dV is a relationship of a potential of the single electrode or a voltage V of the energy storage device, between with a differential value dQ/dV obtained by differentiating an amount of charge or a discharge capacity Q with the V.

According to the above configuration, the plurality of the stored energy storage amount characteristics reflect deterioration based on VF of the single electrode, in accordance with the feature value. The information corresponds to the feature value. On the basis of the information and the stored energy storage amount characteristics, it is possible to satisfactorily estimate a current internal state of the energy storage device including a state of the counter electrode by a simple method.

In the estimation device described above, the acquisition unit may include: a second estimation unit that acquires information of the third characteristic and/or the fourth characteristic in a predetermined voltage range of the energy storage device, the estimation device may further include a second estimation unit that obtains a feature value from the information, and refers to the energy storage amount characteristics or the function in accordance with the feature value, to estimate the third characteristic or the fourth characteristic at a time when the information is acquired, wherein the first estimation unit may estimate a parameter indicating an internal state of the energy storage device in accordance with the information and the estimated third characteristic or fourth characteristic.

According to the above configuration, for example, a parameter is obtained by regression calculation on the basis of the energy storage amount characteristics calculated on the basis of the feature value and the stored energy storage amount characteristics or the energy storage amount characteristics calculated on the basis of the function, and the information actually measured in a predetermined voltage range. It is possible to highly accurately estimate a current internal state of the energy storage device including a state of the counter electrode by a simple method.

Even in a complicated use environment, an internal state of the energy storage device can be monitored with high accuracy.

In the estimation device described above, the feature value may be at least one of an amount of charge or a discharge capacity in a predetermined voltage range, and/or an average discharge potential.

A voltage range of an energy storage device corresponding to a potential range in which there is a linear relationship between the amount of charge or the discharge capacity and the average discharge potential, and a potential difference (voltage of energy storage device) from the counter electrode does not change before and after deterioration, is set as the predetermined voltage range. The amount of charge or the discharge capacity in the predetermined voltage range is used as the feature value. A plurality of energy storage amount characteristics are stored in association with the feature value corresponding to a deterioration degree, or stored as a function of the feature value. Using this, current energy storage amount characteristics can be accurately estimated. Similarly, also in a case of using the average discharge potential, the energy storage amount characteristics can be accurately estimated. The current third characteristic and fourth characteristic can be accurately estimated, on the basis of the current energy storage amount-potential characteristics, energy storage amount-voltage characteristics, or V–dQ/dV.

In the estimation device described above, the parameter may be at least one kind selected from the first characteristic, the second characteristic, a ratio of the first characteristic, a degree of single electrode contraction, a degree of counter electrode contraction, a deviation amount of capacity balance between the single electrode and the counter electrode, and polarization.

Note that the ratio of the first characteristic is expressed by the following equation.

(a ratio of the first characteristic)=(a difference in an energy storage amount between the first characteristic and the second characteristic at a potential of the single electrode corresponding to a maximum attainment voltage of the energy storage device stored in the storage unit when the information is acquired)/(a maximum value of the difference in the energy storage amount)

With the above-described parameter, it is possible to detect a state of the single electrode in which VF occurs due to deterioration and a state of the counter electrode, and satisfactorily detect a current internal state of the energy storage device.

In the estimation device described above, the second estimation unit may refer to the V–dQ/dV to estimate V–dQ/dV by interpolation calculation, and the parameter may include a processing coefficient necessary for the interpolation calculation.

According to the above configuration, since the third characteristic or the fourth characteristic is obtained after the estimation of the current V–dQ/dV by interpolation calculation, calculation accuracy and calculation speed are favorable. Then, by using the processing coefficient necessary for the interpolation calculation as a parameter, the third characteristic or the fourth characteristic can be accurately corrected with the parameter obtained by the regression calculation.

In the estimation device described above, the first estimation unit may obtain the parameter by optimization calculation so as to minimize a difference between the information and the third characteristic or the fourth characteristic estimated by the second estimation unit.

According to the above configuration, the current parameter can be accurately obtained by the optimization calculation, and the current internal state of the energy storage device can be accurately detected.

The estimation device described above may further include a third estimation unit that estimates the third characteristic or the fourth characteristic, using the parameter estimated by the first estimation unit.

According to the above configuration, the third characteristic or the fourth characteristic can be corrected and estimated with use of a parameter that accurately represents the current internal state of the energy storage device.

In the estimation device described above, the active material causes two or more electrochemical reactions in accordance with transition of charge-discharge, and hysteresis between the third characteristic and the fourth characteristic exhibited when one electrochemical reaction occurs is smaller than hysteresis when another electrochemical reaction occurs. Further, there may be provided a fourth estimation unit that estimates a third characteristic for reference or a fourth characteristic for reference when estimating an energy storage amount with an acquired voltage, on the basis of the third characteristic or the fourth characteristic estimated by the third estimation unit, and on the basis of a charge-discharge history of the energy storage device.

According to the above configuration, on the basis of the third or fourth characteristic according to a current internal state of the energy storage device, the parameter, and the charge-discharge history of the energy storage device, it is possible to estimate the third or fourth characteristic for reference while accurately reflecting an influence of hysteresis in addition to an influence of VF due to deterioration.

The estimation device described above may further include a fifth estimation unit that estimates an energy storage amount on the basis of the charge-discharge history, the third characteristic or the fourth characteristic for reference, and an acquired voltage.

According to the above configuration, it is possible to easily and satisfactorily estimate an energy storage amount of the energy storage device having an active material that has a VF property and exhibits hysteresis in the energy storage amount-voltage characteristics.

Since the voltage is used, it is possible to estimate a current energy amount stored in the energy storage device, such as watt-hour, as the energy storage amount, without limiting to SOC. On the basis of the charge-discharge characteristics, dischargeable energy up to SOC 0% and charge energy required up to SOC 100% can be predicted. The current remaining watt-hour and storable watt-hour can be estimated.

Therefore, it is possible to accurately perform: balancing in a case of using a plurality of energy storage devices; control of regenerative acceptance; estimation of a travel distance when the energy storage device is mounted on a vehicle; and the like.

An energy storage apparatus according to the embodiment includes the energy storage device and any one of the estimation device described above.

In the above configuration, the energy storage amount of the energy storage device can be accurately estimated even in a complicated use environment.

An estimation method according to the embodiment estimates an internal state of an energy storage device having a single electrode containing an active material in which repeated charge-discharge changes a first characteristic that is an energy storage amount-potential charge characteristic, and a second characteristic that is an energy storage amount-potential discharge characteristic. The estimation method: stores, in a storage unit, a plurality of energy storage amount characteristics that are at least any of first characteristics, second characteristics, third characteristics that are energy storage amount-voltage charge characteristics, fourth characteristics that are energy storage amount-voltage discharge characteristics of the energy storage device, and pieces of V–dQ/dV in correspondence with a change in a feature value, which is changed by repeated charge-discharge, or has stored as a function of the feature value; acquires information relating to a part of the third characteristic and/or the fourth characteristic of the energy storage device; and estimates an internal state of the energy storage device on the basis of the information, and on the basis of the energy storage amount characteristics or the function.

According to the above configuration, the current internal state of the energy storage device can be highly accurately estimated by detecting a state of the single electrode and the counter electrode by a simple method, even in a complicated use environment.

A computer program according to the embodiment causes a computer that estimates an internal state of an energy storage device having a single electrode containing an active material in which repeated charge-discharge changes a first characteristic that is an energy storage amount-potential charge characteristic, and a second characteristic that is an energy storage amount-potential discharge characteristic, to execute processing of acquiring information relating to a part of a third characteristic that is an energy storage amount-voltage charge characteristic and/or a fourth characteristic that is an energy storage amount-voltage discharge characteristic of the energy storage device; referring to a table that stores a plurality of energy storage amount characteristics that are at least any of first characteristics, second characteristics, third characteristics, fourth characteristics, and pieces of V–dQ/dV in correspondence with a change in a feature value, or referring to a function of the feature value; and estimating an internal state of the energy storage device on the basis of the information, and on the basis of the energy storage amount characteristics or the function.

Hereinafter, the present invention will be specifically described with reference to the drawings showing an embodiment.

As described above, a single electrode of an electrode assembly of the energy storage device according to the present embodiment contains an active material having the VF property and having hysteresis in energy storage amount-potential characteristics.

When the active material has the VF property, shapes of an SOC-OCP curve of the single electrode and of an SOC-OCV curve of the energy storage device are changed by repeated charge-discharge. The energy storage device containing this active material has hysteresis in which a maximum potential difference between the SOC-V curves is 100 mV or more in charging from a fully discharged state to a fully charged state (full charge) and in discharging from a fully charge state to a fully discharged state (full discharge) by applying a minute current.

FIG. 1 is a graph showing an example of SOC-OCP of a positive electrode. A horizontal axis represents SOC (%), and a vertical axis represents a potential E as OCP (V vs $Li^+$:$Li/Li^-$). A charge-discharge curve before deterioration is indicated by a broken line, and a charge-discharge curve after deterioration is indicated by a solid line.

As shown in FIG. 1, VF occurs due to deterioration, and the charge-discharge curve shifts downward.

In a case of an active material having no VF property, the hysteresis does not exist, and the SOC-OCP curve of the single electrode is not changed by repeated charge-discharge. A shape of the SOC-OCV curve of the energy storage device is changed by repeated charge-discharge, due to deterioration (curve reduction) of the single electrode or expansion of a deviation amount of capacity balance between both electrodes.

In the present embodiment, current internal states of the energy storage device, the single electrode, and the counter electrode are estimated. Examples of a parameter indicating the internal state include at least one kind selected from: an energy storage amount-potential charge characteristic (first characteristic) of the single electrode or V–dQ/dV thereof; an energy storage amount-potential discharge characteristic (second characteristic) of the single electrode or V–dQ/dV thereof (hereinafter referred to as k); a ratio of an energy storage amount-potential charge characteristic (first characteristic) of the single electrode (Rcha described later); a degree of positive electrode contraction (m); a degree of negative electrode contraction (n); a deviation amount (Δ Qim) in capacity balance between the positive and negative electrodes; polarization (ΔV); or a processing coefficient (q) of interpolation calculation described later. The k can also be expressed as a deterioration degree k' (a state without deterioration is set to be 1.0). The m and n indicate a degree of contraction in an x-axis direction of an energy storage amount-V curve of the positive electrode and an energy storage amount-V curve of the negative electrode, respectively. ΔV represents a degree of contraction in a y-axis direction of the energy storage amount-V curve.

Hereinafter, a case where the energy storage amount is SOC will be described.

(1) First, an information processing unit 60, which will be described later, stores a plurality of energy storage amount characteristics, or stores as a function of a feature value, in accordance with deterioration.

Example of the energy storage amount characteristics include: charge SOC-V (first characteristic) or discharge SOC-V (second characteristic) of the single electrode; charge SOC-V (third characteristic) or discharge SOC-V (fourth characteristic) of the energy storage device; charge V–dQ/dV or discharge V–dQ/dV of the single electrode; charge V–dQ/dV or discharge V–dQ/dV of the energy storage device; and the like.

There is a correlation between the feature value that is changed by repeated charge-discharge and the above-described energy storage amount characteristics.

Examples of the feature value include an amount of charge, a discharge capacity, an average discharge potential, an absolute value of a dQ/dV or dV/dQ peak, a peak intensity ratio thereof, and the like. Examples of the peak intensity ratio of dQ/dV include a ratio of a peak integrated intensity of dQ/dV in a predetermined potential range a and a peak integrated intensity in a potential range b. By taking this ratio, it is possible to estimate energy storage amount characteristics at the present moment regardless of a decrease in the degree m of positive electrode contraction.

Among these, the amount of charge and the discharge capacity are preferable.

In a case of the active material having the VF property, it is considered that a charge-discharge curve shape changes continuously and uniquely in correspondence with a change (deterioration) in the feature value. Regarding $LiMeO_2$—$Li_2MnO_3$ based active materials, it has been reported that a crystal structure changes with repeated charge-discharge (Journal of Power Sources, vol. 229 (2013), pp 239 to 248). It is considered that the charge-discharge curve shape changes as the crystal structure changes. A result of the article suggests that the crystal structure changes continuously in a charge-discharge cycle at a short-term single temperature level. Further, from a report that the crystal structure has changed from a layered state to a spinel analog crystal, it is inferred that the way of change is one. That is, at a short-term single temperature level, a crystal structure continuously and uniquely changes. From this report, the present inventor and the like have considered that the charge-discharge curve shape changes continuously and uniquely in accordance with a change of the crystal structure, also in a long term and in any use history. From an experimental result to be described later, it has been confirmed that the charge-discharge curve shape changes continuously and uniquely also in a long term and even if the use history is different.

In a case of an active material having no VF property, the charge-discharge curve shape of the single electrode is not changed by repeated charge-discharge. As described above, the charge-discharge curve shape of the cell is changed by repeated charge-discharge individually, that is, non-uniquely, due to deterioration of the single electrode or expansion in a deviation amount of capacity balance.

In a case of the present embodiment, the energy storage amount characteristics of the single electrode continuously and uniquely change with respect to a change in the feature value. Therefore, current first SOC-V (third characteristic or fourth characteristic) can be accurately estimated, and the parameter can be accurately estimated on the basis of this, by storing a part of change transition of the energy storage amount characteristics with respect to a change in the feature value.

That is, first, a plurality of any of the above-described energy storage amount characteristics are stored in the table in correspondence with a change in the feature value according to deterioration. When SOC-V or V–dQ/dV of the single electrode is stored, SOC-V or V–dQ/dV of the counter electrode is also stored. SOC-V is a characteristic obtained when charging or discharging with a minute current. The SOC-V of the single electrode may be SOC-OCP. The SOCV of the energy storage device may be SOC-OCV.

In a case where the counter electrode is a negative electrode and is made of a material such as, for example, graphite, hard carbon, Ti, and the like, and no voltage fade occurs over time, SOC-V or V–dQ/dV in a new product is stored. When voltage fade occurs with time, a plurality of pieces of SOC-V or V–dQ/dV are stored in accordance with deterioration. In addition, it is preferable to provide a parameter related to the negative electrode in addition to the Δ Qim and the n.

Instead of storing the plurality of energy storage amount characteristics, a function of the feature value may be stored.

(2) A CPU 62 acquires actual measured charge SOC-V or actual measured discharge SOC-V (information relating to a part of the third characteristic or the fourth characteristic) with a constant current in a current predetermined voltage range. The voltage may be OCV. A potential range of the single electrode may be obtained in consideration of an assumed potential of the counter electrode, and the voltage range may be set from the potential range.

A feature value is extracted from the actual measured SOC-V. When the feature value is an amount of charge or a discharge capacity, a numerical value in the predetermined voltage range is to be extracted. When the feature value is an average discharge potential, the feature value is obtained by dividing integrated power (Wh) at a time of discharge by a discharge capacity (Ah).

As a potential range of the single electrode corresponding to the predetermined voltage range, it is preferable to select a range in which there is a linear relationship between the amount of charge or the discharge capacity and the average discharge potential of the single electrode, and a potential difference (energy storage device voltage) from the counter electrode does not change before and after deterioration. It is preferable to select a wide potential range on a high potential side in which the energy storage amount characteristics do not greatly change depending on the charge-discharge history. In consideration of the potential of the counter electrode estimated at the present moment, the battery voltage is converted into a potential of the single electrode.

Figure 2:
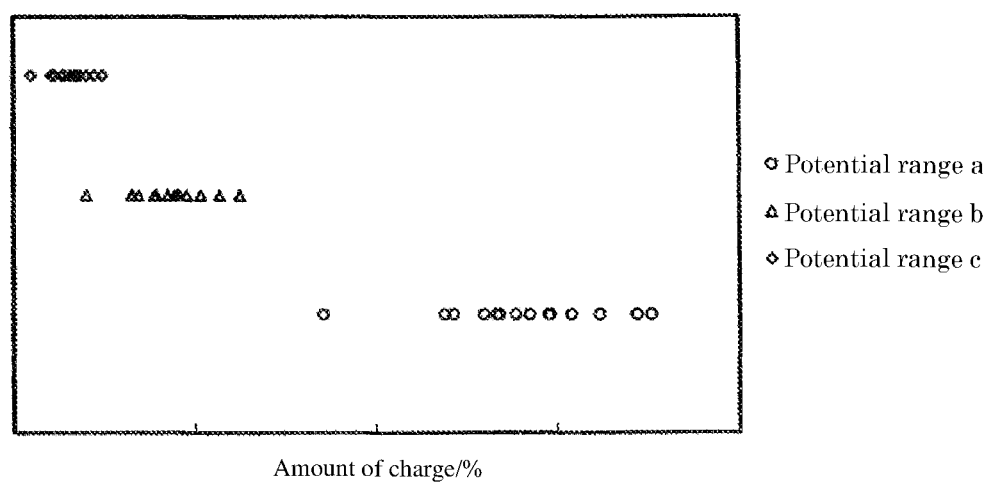
FIG. 2 is a conceptual view showing a relationship between a potential range of a positive electrode corresponding to a predetermined voltage range and a range of an amount of charge corresponding to each deterioration state in each potential range.

FIG. 2 is a conceptual view showing a relationship between a potential range of a positive electrode corresponding to the predetermined voltage range and a range of an amount of charge corresponding to each deterioration state in each potential range. The potential range becomes narrower in the order of a, b, and c. When the potential range is narrowed, the range of the amount of charge is narrowed. That is, an error increases with a decrease of the potential range to be used. Whereas, when the potential range is wide, time and efforts are required to acquire the amount of charge. Therefore, it is preferable to set an appropriate potential range in consideration of balance between estimation accuracy and ease of measurement.

(3) The CPU 62 refers to the stored energy storage amount characteristics or function on the basis of the current feature value, to calculate first charge SOC-V or first discharge SOC-V (third characteristic or fourth characteristic) of the energy storage device.

First, after obtaining the k (SOC-V or V–dQ/dV of the single electrode) on the basis of the stored energy storage amount characteristics or function, the first SOC-V of the energy storage device is preferably obtained. In this case, calculation accuracy and calculation speed are favorable. When the feature value is the amount of charge or the discharge capacity, k can also be accurately obtained.

(4) The CPU 62 performs optimization calculation on the basis of the actual measured charge SOC-V (or actual measured discharge SOC-V) and the first charge SOC-V (or the first discharge SOC-V), to obtain a parameter. An internal state is estimated with the parameter. Rcha, q, k, or k' is not essential as an initial value of the parameter, but is preferably inputted as an initial value from the viewpoint of calculation accuracy and calculation speed.

(5) The CPU 62 calculates the second charge SOC-V or the second discharge SOC-V (third characteristic or fourth characteristic) on the basis of the parameter.

First Embodiment

Hereinafter, as a first embodiment, an energy storage apparatus to be mounted on a vehicle is exemplified.

Figure 3:
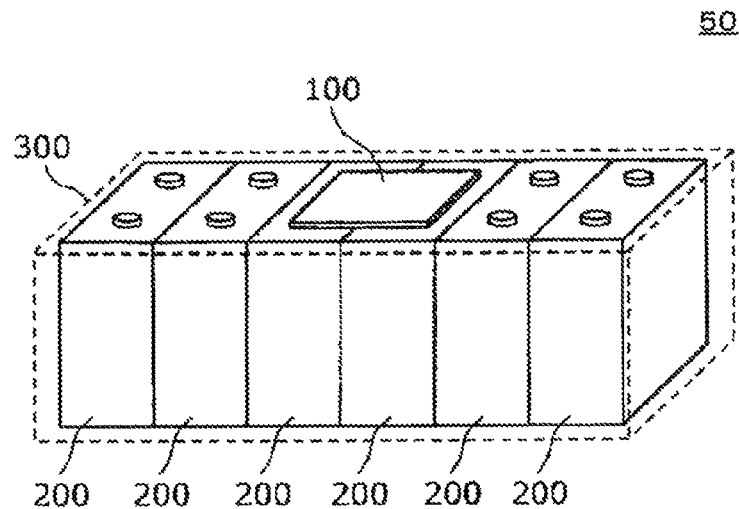
FIG. 3 is a perspective view showing an example of an energy storage apparatus.

FIG. 3 shows an example of an energy storage apparatus. An energy storage apparatus 50 includes a plurality of energy storage devices 200, a monitoring device 100, and a housing case 300 to house these. The energy storage apparatus 50 may be used as a power source for an electric vehicle (EV) or a plug-in hybrid electric vehicle (PHEV).

The energy storage device 200 is not limited to a prismatic cell, and may be a cylindrical cell or a pouch cell.

The monitoring device 100 may be a circuit board arranged to face the plurality of energy storage devices 200. The monitoring device 100 monitors a state of the energy storage device 200. The monitoring device 100 may be an estimation device. Alternatively, a computer or a server that is connected by wire or wirelessly to the monitoring device 100 may execute an internal state estimation method on the basis of information outputted from the monitoring device 100.

Figure 4:
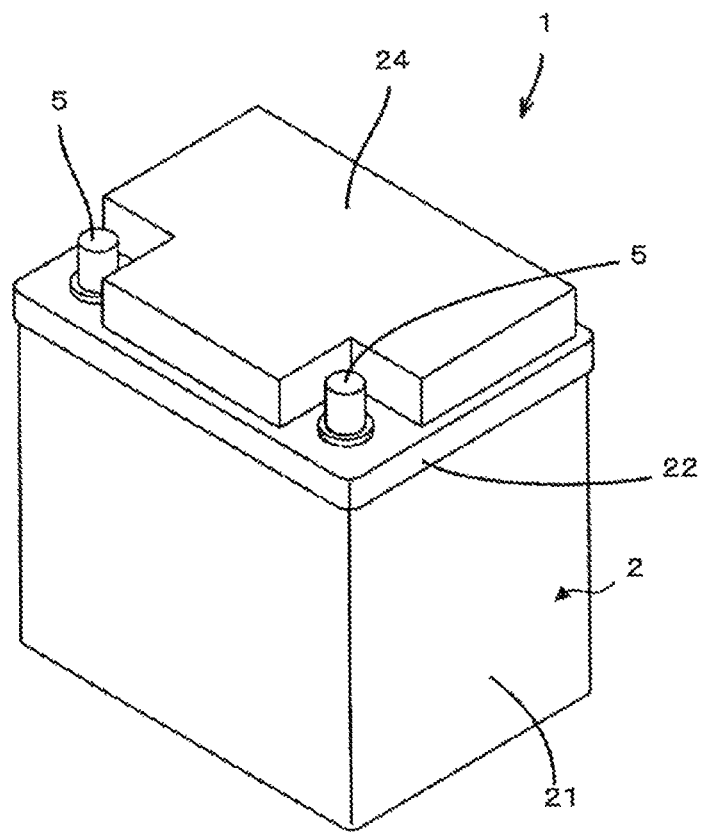
FIG. 4 is a perspective view showing another example of the energy storage apparatus.
Figure 5:
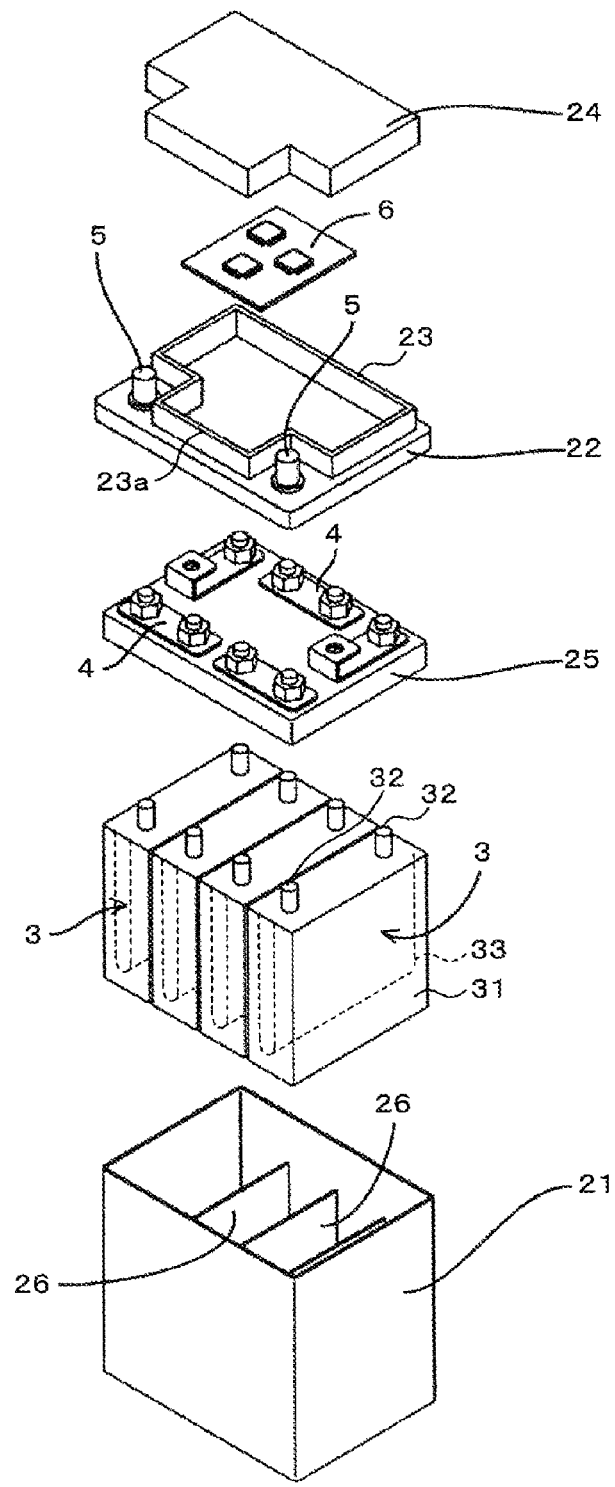
FIG. 5 is an exploded perspective view of a battery module.
Figure 6:
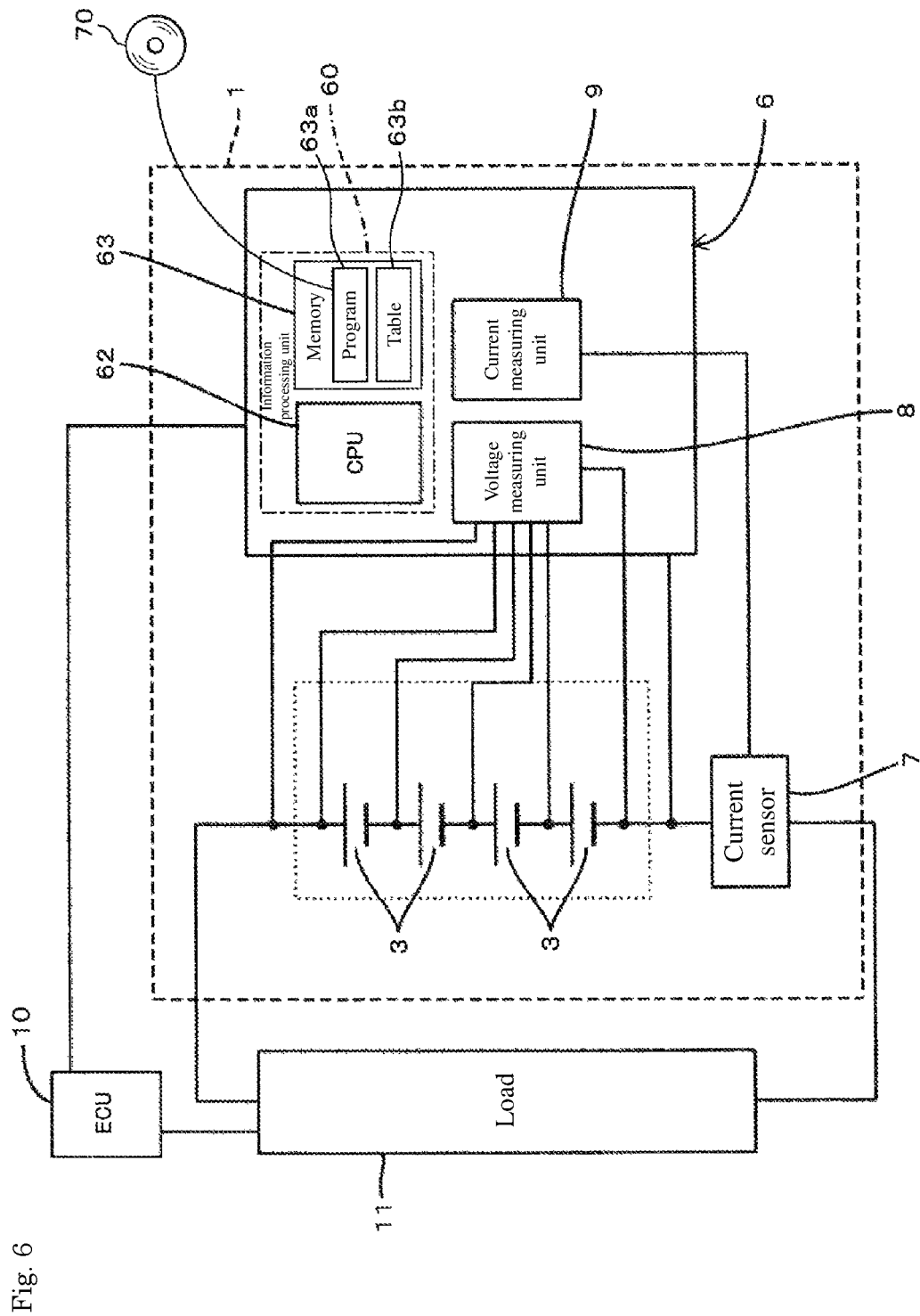
FIG. 6 is a block diagram of the battery module.

FIG. 4 shows another example of the energy storage apparatus. The energy storage apparatus (hereinafter referred to as a battery module) 1 may be a 12-volt power source or a 48-volt power source that is suitably mounted on an engine vehicle. FIG. 4 is a perspective view of a battery module 1 for 12 V power source, FIG. 5 is an exploded perspective view of the battery module 1, and FIG. 6 is a block diagram of the battery module 1.

The battery module 1 has a rectangular parallelepiped case 2. The case 2 houses a plurality of lithium ion secondary batteries (hereinafter referred to as batteries) 3, a plurality of bus bars 4, a battery management unit (BMU) 6, and a current sensor 7.

The battery 3 includes a rectangular parallelepiped case 31 and a pair of terminals 32 and 32 provided on one side surface of the case 31 and having different polarities. The case 31 houses an electrode assembly 33 in which a positive electrode plate, a separator, and a negative electrode plate are stacked.

In the electrode assembly 33, at least one of a positive active material included in the positive electrode plate or a negative active material included in the negative electrode plate has VF and hysteresis properties.

Examples of the positive active material include a Li-rich active material such as above-mentioned $LiMeO_2$—$Li_2MnO_3$ solid solution, $Li_2O$—$LiMeO_2$ solid solution, $Li_3NbO_4$—$LiMeO_2$ solid solution, $Li_4WO_5$—$LiMeO_2$ solid solution, $Li_4TeO_5$—$LiMeO_2$ solid solution, $Li_3SbO_4$—$LiFeO_2$ solid solution, $Li_2RuO_3$—$LiMeO_2$ solid solution, or $Li_2RuO_3$—$Li_2MeO_3$ solid solution. Examples of the negative active material include hard carbon, metal or alloy such as Si, Sn, Cd, Zn, Al, Bi, Pb, Ge, and Ag, chalcogenides containing these, and the like. An example of the chalcogenide is SiO. The technology of the present invention is applicable as long as at least one of the positive active material or negative active material is included.

The case 2 is made of synthetic resin. The case 2 includes: a case body 21; a lid 22 that closes an opening of the case body 21; a BMU housing 23 provided on an outer surface of the lid 22; a cover 24 that covers the BMU housing 23; an inner lid 25; and a partition plate 26. The inner lid 25 and the partition plate 26 need not be provided.

The battery 3 is inserted between the individual partition plates 26 of the case body 21.

The plurality of metal bus bars 4 are placed on the inner lid 25. The inner lid 25 is disposed on a terminal surface provided with the terminal 32 of the battery 3, the adjacent terminals 32 of the adjacent batteries 3 are connected by the bus bar 4, and the batteries 3 are connected in series.

The BMU housing 23 has a box shape, and has a protrusion 23a that protrudes outward in a prismatic shape at a center of one long side surface. On both sides of the protrusion 23a on the lid 22, there are provided a pair of external terminals 5 and 5 made of metal such as lead alloy and having different polarities. The BMU 6 is configured by mounting an information processing unit 60, a voltage measuring unit 8, and a current measuring unit 9 on a substrate. The BMU housing 23 houses the BMU 6, and the cover 24 covers the BMU housing 23, whereby the battery 3 and the BMU 6 are connected.

As shown in FIG. 6, the information processing unit 60 includes the CPU 62 and the memory 63.

The memory 63 stores an internal state estimation program (hereinafter referred to as a program) 63a according to the present embodiment and a table 63b. The program 63a is provided in a state of being stored in a computer-readable recording medium 70 such as a CD-ROM, a DVD-ROM, or a USB memory, for example, and is stored in the memory 63 by being installed in the BMU 6. Alternatively, the program 63a may be acquired from an external computer (not shown) connected to a communication network, and stored in the memory 63.

The table 63b stores, as an example, a plurality of pieces of positive electrode SOC-V or V–dQ/dV thereof, negative electrode SOC-V or V–dQ/dV thereof, or a function of the feature value, corresponding to deterioration. The memory 63 and the CPU 62 that functions as the estimation unit (particularly the first estimation unit) are not limited to a case of being mounted on the BMU 6. These may be mounted on an external device, and an internal state may be estimated when the actual measured charge SOC-V or the actual measured discharge SOC-V in a predetermined voltage range is acquired, and a result may be passed to the BMU 6.

The table 63b may store SOC-V of the battery 3 or V–dQ/dV thereof.

The energy storage amount characteristics stored in the table 63b will be described with a specific example.

Each battery 3 has been subjected to a cycle test of each No. under conditions of a voltage range, a number of cycles, and a test temperature shown in Table 1 below.

TABLE 1

| No. | Voltage range | Number of cycles | Test temperature |
|---|---|---|---|
| 1 | 2.0-4.6 V | 0 th | 25° C. |
| 2 | 2.0-4.6 V | 10 th | 25° C. |
| 3 | 2.0-4.6 V | 25 th | 25° C. |
| 4 | 2.0-4.6 V | 50 th | 25° C. |
| 5 | 2.0-4.6 V | 75 th | 25° C. |
| 6 | 2.0-4.6 V | 100 th | 25° C. |
| 7 | 2.0-4.35 V | 500 th | 25° C. |
| 8 | 2.0-4.475 V | 500 th | 25° C. |
| 9 | 2.0-4.6 V | 500 th | 25° C. |
| 10 | 2.5-4.6 V | 500 th | 25° C. |
| 11 | 3.0-4.6 V | 500 th | 25° C. |
| 12 | 3.5-4.6 V | 500 th | 25° C. |
| 13 | 4.0-4.6 V | 500 th | 25° C. |
| 14 | 2.0-4.35 V | 1000 th | 45° C. |
| 15 | 2.0-4.6 V | 1000 th | 45° C. |

Charge-discharge conditions are as follows.
Negative electrode: Graphite
Test rate: charge 0.5 CA, discharge 1.0 CA
Conditions of a confirmation test for obtaining SOC-V of the positive electrode are as follows.
Negative electrode: Li metal
Test rate: charge 0.1 CA, discharge 0.1 CA
Test temperature: 25° C.

As a result, for the test of each No., SOCV or V–dQ/dV of the positive electrode is obtained as the energy storage amount characteristics. These energy storage amount characteristics are stored in the table 63b in association with an amount of charge or a discharge capacity in a predetermined voltage range, or the average discharge potential. By each test, the energy storage amount characteristics of the single electrode in a deteriorated state are acquired and arranged in an order of the feature value, and the feature value and the energy storage amount characteristics are associated with each other. It is confirmed that the energy storage amount characteristics change continuously and uniquely in a long term and even if the use history is different.

The SOC-V of the active material of the counter electrode is stored in the table 63b.

The CPU 62 executes an internal state estimation process, which will be described later, in accordance with a program read from the memory 63.

The voltage measuring unit 8 is connected to each of both ends of the battery 3 via a voltage detection line, and measures a voltage of each battery 3 at a predetermined time interval.

The current measuring unit 9 measures a current flowing through the battery 3 via the current sensor 7 at a predetermined time interval.

The external terminals 5 and 5 of the battery module 1 are connected to a starter motor for engine starting and a load 11 such as an electrical component.

An electronic control unit (ECU) 10 is connected to the BMU 6 and the load 11.

Hereinafter, the internal state estimation method according to the present embodiment will be described.

Figure 7:
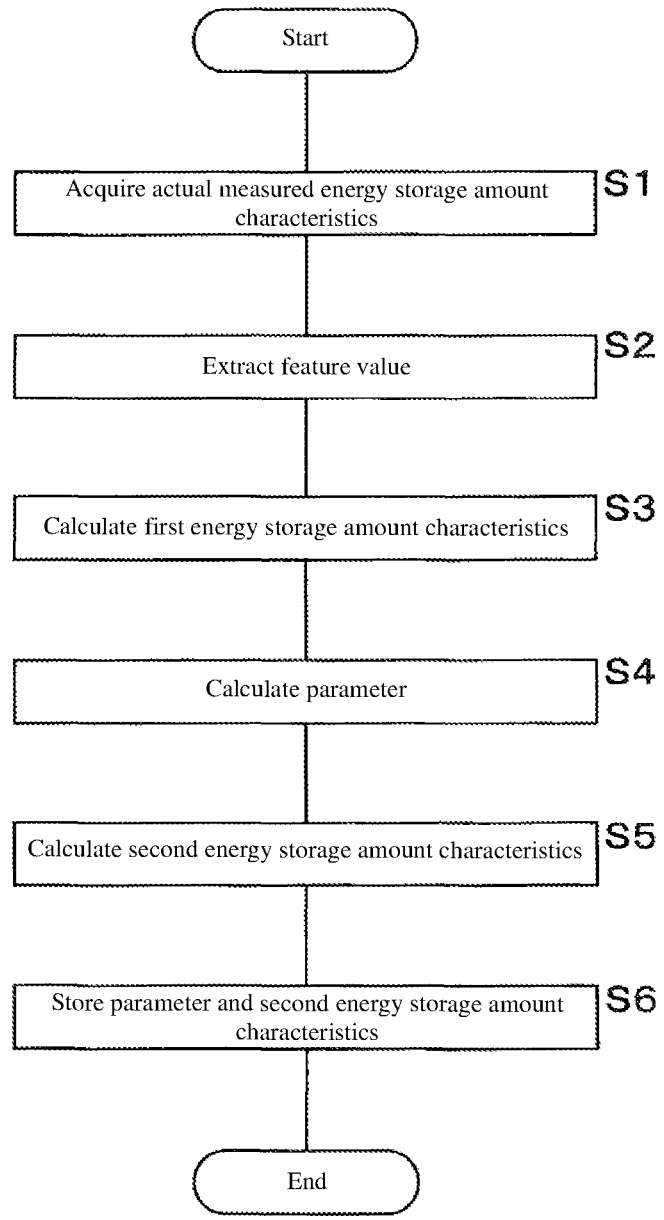
FIG. 7 is a flowchart showing a procedure of a process for estimating a parameter and energy storage amount characteristics by a CPU.

FIG. 7 is a flowchart showing a procedure of a process for estimating a parameter and energy storage amount characteristics by the CPU 62.

The CPU 62 repeats the processing from S1 at a predetermined interval.

The CPU 62 acquires actual measured energy storage amount characteristics with a constant current in a predetermined voltage range (S1). For example, the CPU 62 acquires SOC-V for charge or discharge.

The CPU 62 extracts a feature value from the actual measured energy storage amount characteristics (S2). For example, the CPU 62 extracts an amount of charge in a predetermined voltage range from the SOC-V.

The CPU 62 calculates first energy storage amount characteristics of the battery 3 on the basis of the acquired feature value. (S3).

The CPU 62 calculates a parameter by performing optimization calculation on the basis of the actual measured energy storage amount characteristics and the first energy storage amount characteristics (S4). A design variable is the parameter described above, and an objective function is a residual square sum f(x).

The CPU 62 calculates the energy storage amount characteristics again on the basis of the parameter, to obtain second energy storage amount characteristics (S5).

The CPU 62 stores the calculated parameter and the second energy storage amount characteristics in the table 63b (S6), and ends the processing.

Hereinafter, description will be specifically made. First, the above-mentioned S1 to S3 will be described.

(1) The CPU 62 acquires SOC-V of the battery 3 in a voltage range C1 V to C2 V (S1). The CPU 62 extracts an amount of charge Q(x) as a feature value from the SOC-V at a time when the voltage range is C1 V to C2 V, that is, a potential range of the positive electrode is P1 V to P2 V (S2). This amount of charge is defined as QinP1-P2V.

(2) It is assumed that V–dQ/dV of the positive electrode is stored in the table 63b in association with QinP1-P2V for No. 1 to No. 15 in Table 1. Further, it is assumed that V–dQ/dV of the negative electrode at a time of a new product is also stored.

For example, when the acquired feature value Q(x)inP1-P2V is between individual pieces of QinP1-P2V of No. 12 and No. 15 in Table 1, the CPU 62 acquires V–dQ/dV of each of No. 12 and No. 15. The CPU 62 performs interpolation calculation using these two pieces of V–dQ/dV, and calculates V–dQ/dV corresponding to the feature value. A balance method is an example of the interpolation calculation.

V–dQ/dV to be obtained is obtained by the following equation.

$$dQ/dV = dQ/dV(i) \times q + dQ/dV(i-1) \times (1-q)$$

Note that dQ/dV(i): dQ/dV of No. i, which is dQ/dV of No. 15 here dQ/dV(i−1): dQ/dV of No. i−1, which is dQ/dV of No. 12 here q: a processing coefficient for interpolation calculation, $0 \leq q \leq 1$ $$q = (Q(i-1) - Q(x))/(Q(i-1) - Q(i))$$

Q(i): QinP1-P2V of No. i, which is QinP1-P2V of No. 15 here
Q(i−1): QinP1-P2V of No. i−1, which is QinP1-P2V of No. 12 here As described above, since the active material of the positive electrode has a hysteresis property, QinP1-P2V varies by several tens of percent at the maximum. Therefore, Q(x) is preferably corrected as follows.

Figure 8:
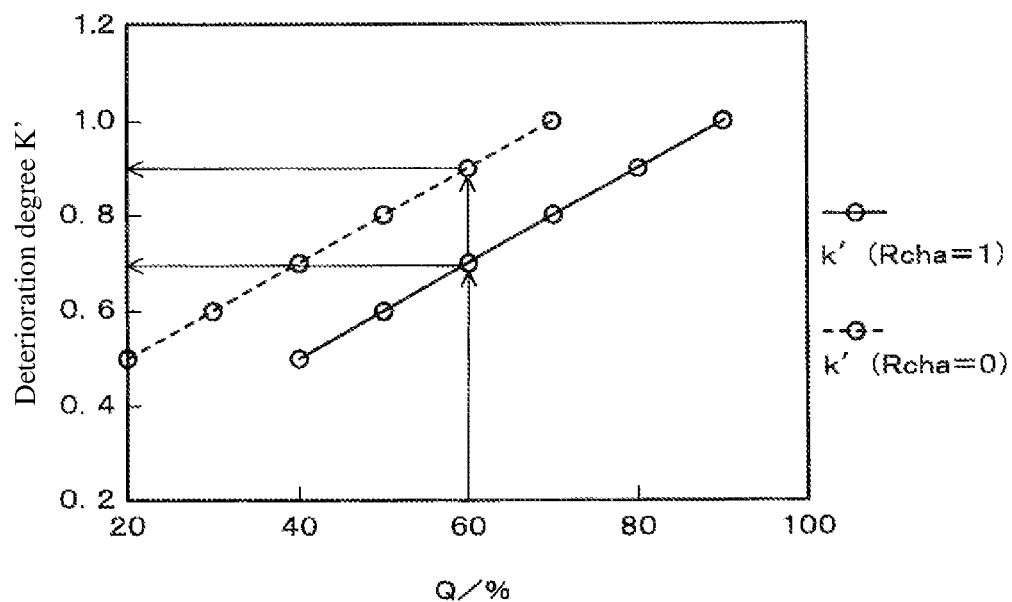
FIG. 8 is a graph showing a relationship between a deterioration degree k' and an amount of charge Q in a potential range P1-P2V.

FIG. 8 is a graph showing a relationship between the deterioration degree k' and an amount of charge QinP1-P2V in a potential range P1-P2V. A horizontal axis represents an amount of charge (%), and a vertical axis represents the deterioration degree k'. In FIG. 8, a solid line graph is a graph at a time of charge, and a broken line graph is a graph at a time of discharge.

As shown in FIG. 8, there is a linear correlation between Q and k'. Whereas, the amount of charge varies depending on a charge state due to hysteresis. In a case of FIG. 8, there is a variation of 20% at maximum.

When Q(x) is the amount of charge, a correction value Q(x),cha is calculated by the following equation.

$$Q(x),cha = n \times (100 + \Delta Qox, max \times Rcha)/100 \times Q$$
$$((Rcha=0))$$

Note that n: positive electrode effectiveness (a degree of positive electrode contraction), $0 \leq n \leq 1$ $\Delta Qox,max$: a variation amount, a maximum value of $\Delta Qox$ (%)

$$\Delta Qox = \Delta SOC \, max - \Delta SOC$$

$\Delta SOC$: a difference in SOC between full discharge SOC-V and full charge SOC-V at Vup'

Vup': a potential of a positive electrode corresponding to a maximum attainment voltage (upper reference voltage) Vup of the battery 3, which will be described later, stored in the memory 63 at a time when SOC-V of the battery 3 is acquired $\Delta SOCmax$: a maximum value of $\Delta SOC$ Rcha: a ratio of charge SOC-V of the positive electrode, $Rcha=(\Delta Qox,max-\Delta Qox)/\Delta Qox,max=\Delta SOC/\Delta SOCmax$, $0 \leq Rcha \leq 1$ Q (Rcha=0): a discharge capacity When Q(x) is the discharge capacity, the correction value Q(x),dis is calculated by the following equation.

$$Q(x),dis = n \times Q(x)$$

The estimation of the deterioration degree k' depends on accuracy of Rcha. As the potential range of the single electrode, a range is selected in which there is a linear relationship between the amount of charge or the discharge capacity and the average discharge potential of the single electrode, and a potential difference from the counter electrode does not change before and after deterioration. However, the range may change depending on a state of the counter electrode. Since SOC-V of the battery 3 changes depending on a state of the counter electrode, it is necessary to estimate an internal state including the state of the counter electrode in order to control the battery 3.

The internal state can be satisfactorily estimated by obtaining SOC-V of the positive electrode from Q(x) and Rcha, obtaining first SOC-V of the battery 3, and performing optimization calculation on the basis of actual measured SOC-V (3) The CPU 62 converts V–dQ/dV of the positive electrode obtained with Q(x) into SOC-V of the positive electrode. Then, the CPU 62 calculates SOC-V (first energy storage amount characteristics) of the battery 3 on the basis of the SOC-V of the positive electrode and the SOC-V of the negative electrode (S3). At this time, a processing coefficient $q_1$ of interpolation calculation, SOC-V ($k_1$) of the positive electrode, a ratio $Rcha_1$ of charge SOC-V, the deterioration degree $k'_1$, a degree of positive electrode contraction $m_1$, and a deviation amount $\Delta Qim_1$ of capacity balance have been obtained as parameters.

(4) In S4 described above, the CPU 62 calculates a parameter indicating a current internal state of the battery 3.

The CPU 62 obtains the residual square sum f(x) of the objective function by the following equation.

$$f(x) = \Sigma_{C1V}^{C2V}(V(\text{calculated value}) - V(\text{actual measured value}))^2$$

Here, the voltage range may be set to a range different from C1 V to C2 V. It is preferable to select a voltage range in which an optimum result is obtained for each of estimation of the first energy storage amount characteristics and estimation of the parameter. The parameters $k_2$, $Rcha_2$, $k'_2$, $m_2$, and $\Delta Qim_2$ at a time when an error between the actual measured SOC-V acquired in S1 and the first SOC-V calculated in S3 is minimized are obtained.

The CPU 62 uses the obtained parameter to calculate charge SOC-V or discharge SOC-V (second energy storage amount characteristics) of the battery 3 (S5).

Figure 9:
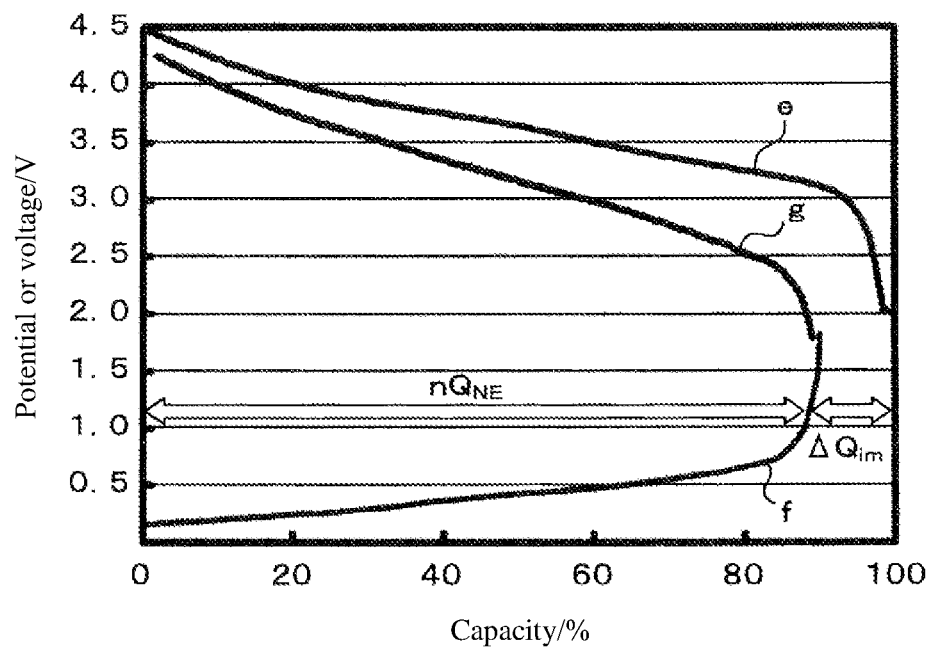
FIG. 9 is a graph showing discharge DOD-V of a positive electrode, discharge DOD-V of a battery, and DOD-V of a negative electrode that are calculated with use of a parameter obtained in S4.

FIG. 9 is a graph showing discharge DOD-V of the positive electrode, discharge DOD-V of the battery 3, and DOD-V of the negative electrode that are calculated with use of the parameter obtained in S4. A horizontal axis represents a capacity (%), and a vertical axis represents a potential or a voltage (V). In the figure, e is DOD-V of the positive electrode, f is DOD-V of the negative electrode, and g is DOD-V of the battery 3.

The obtained $\Delta Qim_2$ is a deviation amount $\Delta Qim$ of capacity balance, which is a capacity difference between the positive electrode and the negative electrode shown by the graph of e and f.

Similarly, a parameter indicating a current internal state of the battery 3 is obtained with, as design variables, a degree of negative electrode contraction (n) and polarization ($\Delta V$), which are other parameters. The internal resistance (R) can be calculated from the polarization ($\Delta V$) and a current at a time when the actually measured energy storage amount characteristics are acquired.

Figure 10:
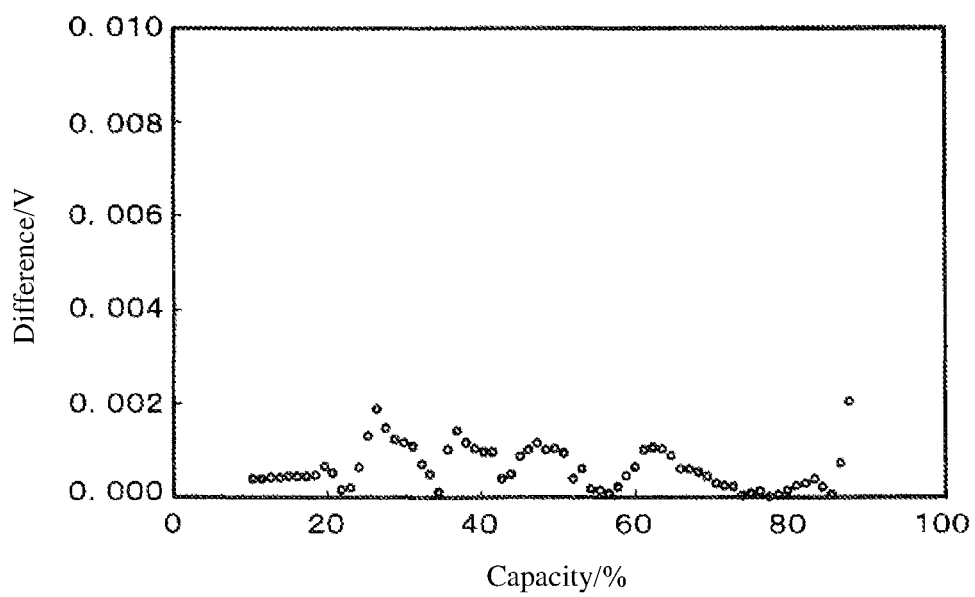
FIG. 10 is a graph showing a result of obtaining a difference of actually measured SOC-V and second SOC-V calculated by obtaining a parameter with the above-mentioned method, when charge-discharge of 2.0 to 4.6 V is repeated 50 cycles for each battery.

FIG. 10 is a graph showing a result of obtaining a difference of actually measured SOC-V and second SOC-V calculated by obtaining a parameter with the above-mentioned method, when charge-discharge of 2.0 to 4.6 V is repeated 50 cycles for each battery 3. A horizontal axis represents a capacity (%), and a vertical axis represents a difference (V).

The difference is obtained by the following equation.

Difference={voltage of battery 3(calculated value)}–{voltage of battery 3 (actual measured value)}

FIG. 10 shows that the difference is small.

Figure 11:
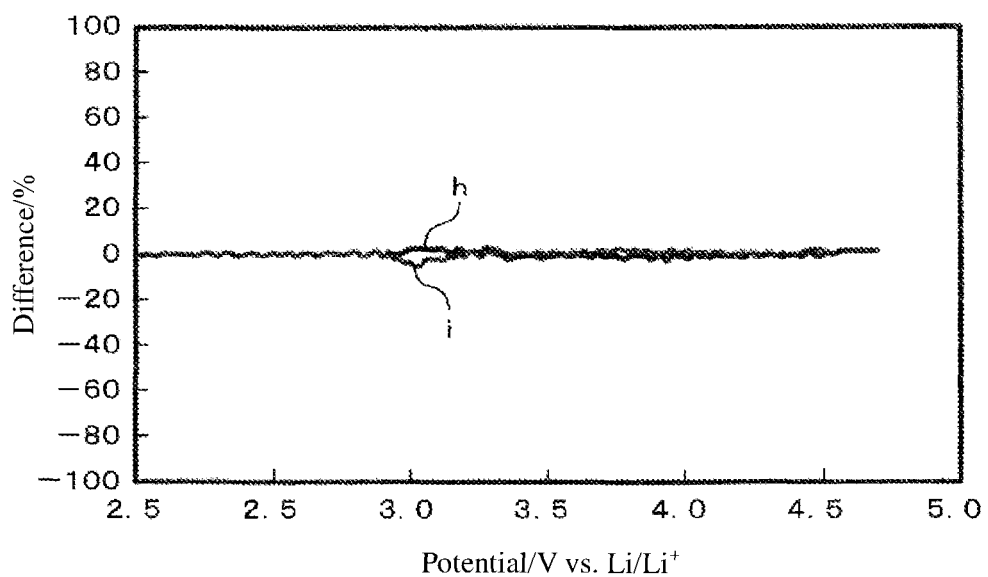
FIG. 11 is a graph showing a result of obtaining a difference of an actual measured value and a calculated value of V–dQ/dV of the positive electrode, when charge-discharge of 2.0 to 4.6 V is repeated 50 cycles for each battery.

FIG. 11 is a graph showing a result of obtaining a difference of an actual measured value and a calculated value of V–dQ/dV of the positive electrode, when charge-discharge of 2.0 to 4.6 V is repeated 50 cycles for each battery 3. A horizontal axis represents a potential (V vs $Li/Li^+:Li/Li^+$), and a vertical axis represents a difference (%). In the figure, h indicates a difference in charge V–dQ/dV, and i indicates a difference in discharge V–dQ/dV.

The actual measured value of V–dQ/dV of the positive electrode is obtained by disassembling the battery 3 in which charge-discharge has been repeated 50 cycles and obtaining V–dQ/dV of only the positive electrode.

The difference is obtained by the following equation.

Difference={dQ/dV(calculated value)–dQ/dV(actual measured value)}/(maximum absolute value of dQ/dV(actual measured value))×100

FIG. 11 shows that the difference is small.

Figure 12:
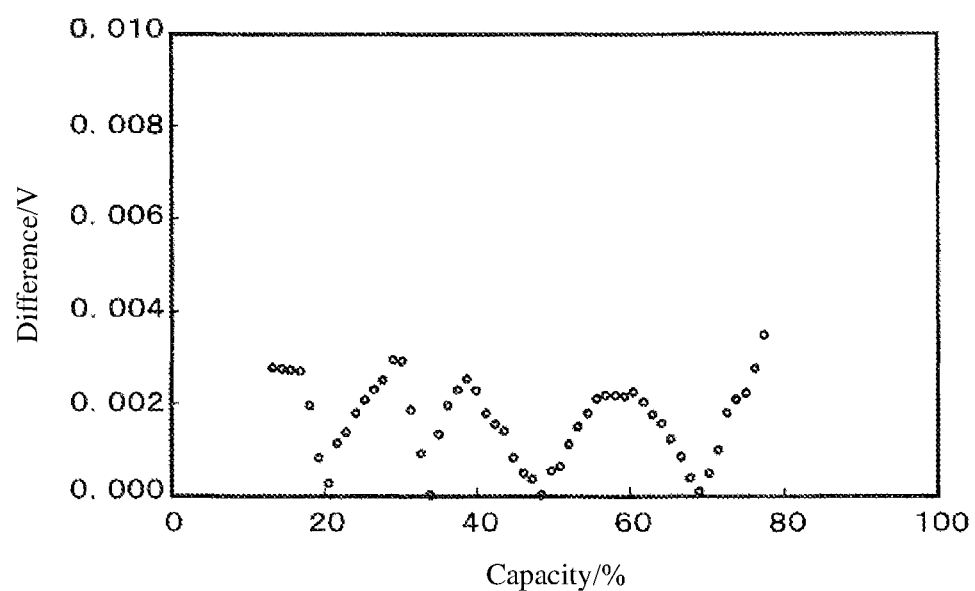
FIG. 12 is a graph showing a result of obtaining a difference of actually measured SOC-V and second SOC-V calculated by obtaining a parameter with the above-mentioned method, when charge-discharge of 2.0 to 4.6 V is repeated 500 cycles for each battery.

FIG. 12 is a graph showing a result of obtaining a difference of actually measured SOC-V and second SOC-V calculated by obtaining a parameter with the above-mentioned method, when charge-discharge of 2.0 to 4.6 V is repeated 500 cycles for each battery 3. A horizontal axis represents a capacity (%), and a vertical axis represents a difference (V).

The difference is obtained by the following equation.

Difference={voltage of battery 3(calculated value)}−{voltage of battery 3(actual measured value)}

FIG. 12 shows that the difference is small.

Figure 13:
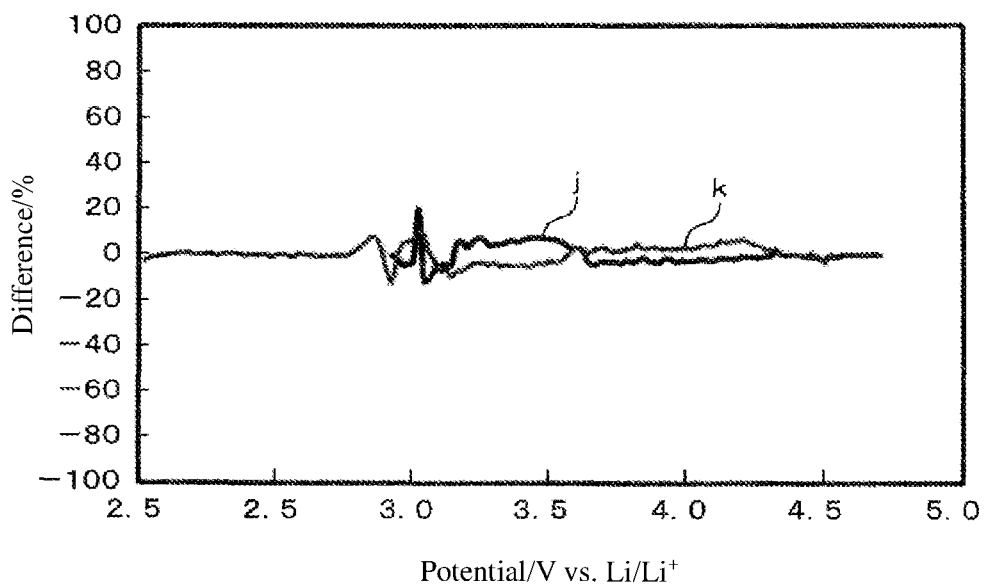
FIG. 13 is a graph showing a result of obtaining a difference of an actual measured value and a calculated value of V–dQ/dV of the positive electrode, when charge-discharge of 2.0 to 4.6 V is repeated 500 cycles for each battery.

FIG. 13 is a graph showing a result of obtaining a difference of an actual measured value and a calculated value of V−dQ/dV of the positive electrode, when charge-discharge of 2.0 to 4.6 V is repeated 500 cycles for each battery 3. A horizontal axis represents a potential (VV vs Li/Li$^+$: Li/Li$^+$), and a vertical axis represents a difference (%). In the figure, j indicates a difference in charge V−dQ/dV, and k indicates a difference in discharge V−dQ/dV.

The actual measured value of V−dQ/dV of the positive electrode is obtained by disassembling the battery 3 in which charge-discharge has been repeated 50 cycles and obtaining V−dQ/dV of only the positive electrode.

The difference is obtained by the following equation.

Difference={dQ/dV(calculated value)−dQ/dV(actual measured value)}/(maximum absolute value of dQ/dV(actual measured value))×100

FIG. 13 shows that the difference is small.

Hereinafter, description will be made on a case where SOC is estimated with use of the most recently stored second SOC-V.

Figure 14:
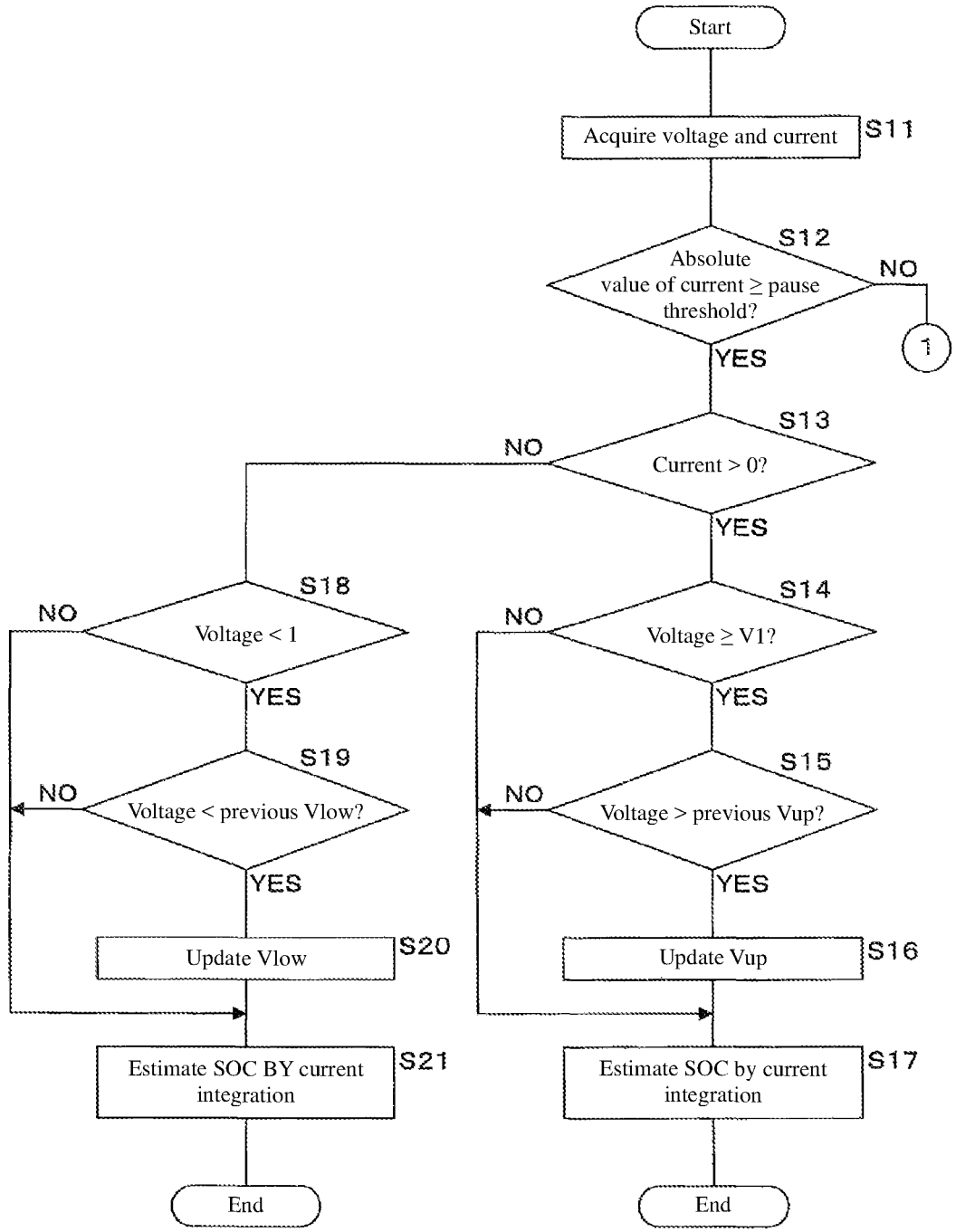
FIG. 14 is a flowchart showing a procedure of an SOC estimation process by the CPU.
Figure 15:
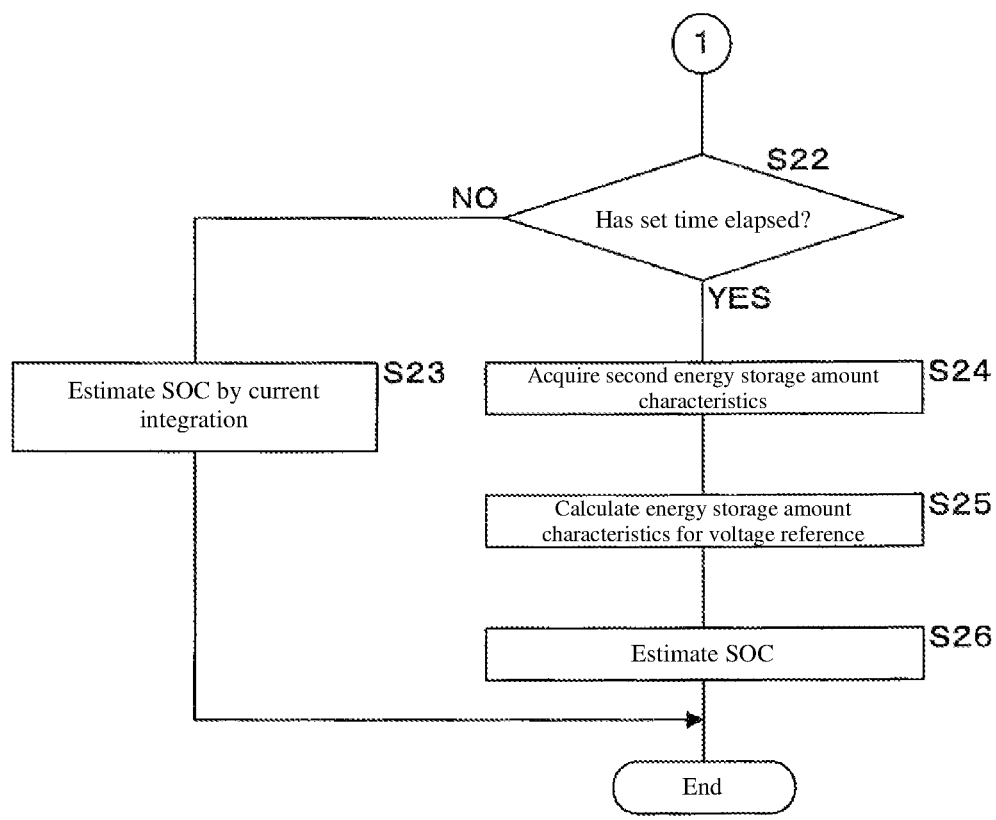
FIG. 15 is a flowchart showing a procedure of the SOC estimation process by the CPU.

FIGS. 14 and 15 are flowcharts showing a procedure of an SOC estimation process performed by the CPU 62. The CPU 62 repeats the processing from S11 at a predetermined interval. Hereinafter, a case where the second energy storage amount characteristics are SOC-OCV will be described.

A voltage with a small oxidation amount and a small reduction amount of reaction causing hysteresis is obtained in advance through experiments, and is set as a threshold V1. A voltage acquired after a voltage becomes nobler than V1 is set as an upper reference voltage (Vup). The Vup is updated when the acquired voltage is higher than the previously acquired voltage. A voltage acquired after a voltage becomes poorer than V1 is set to a lower reference voltage (Vlow). The Vlow is updated when the acquired voltage is smaller than the previously acquired voltage.

The CPU 62 acquires a voltage and a current between terminals of the battery 3 (S11). In a case where a threshold V1 and the upper reference voltage Vup are represented by OCV, it is necessary to correct the acquired voltage to OCV when the current amount of the battery 3 is large. A correction value to OCV can be obtained by estimating a voltage when the current is zero, and the like, with use of a regression line from a plurality of voltage and current data. When a current amount flowing through the battery 3 is as small as a dark current (is a minute current), the acquired voltage is regarded as OCV.

The CPU 62 determines whether or not an absolute value of the current is equal to or greater than a pause threshold (S12). The pause threshold is set in order to determine whether a state of the battery 3 is a charge state, a discharge state, or a pause state. When the CPU 62 determines that the absolute value of the current is not equal to or greater than the pause threshold (S12: NO), the processing proceeds to S22.

When the CPU 62 determines that the absolute value of the current is equal to or greater than the pause threshold (S12: YES), the CPU 62 determines whether or not the current is larger than 0 (S13). When the current is larger than 0, it can be determined that the state of the battery 3 is the charge state. When the CPU 62 determines that the current is not greater than 0 (S13: NO), the processing proceeds to S18.

When the CPU 62 determines that the current is larger than 0 (S13: YES), the CPU 62 determines whether or not the voltage is equal to or higher than V1 (S14). When the CPU 62 determines that the voltage is not equal to or higher than V1 (S14: NO), the processing proceeds to S17.

When the CPU 62 determines that the voltage is equal to or higher than V1 (S14: YES), the CPU 62 determines whether or not the acquired voltage is greater than Vup that is previously stored in the memory 63 (S15). When the CPU 62 determines that the voltage is not higher than the previous Vup (S15: NO), the processing proceeds to S17.

When the CPU 62 determines that the voltage is higher than the previous Vup (S15: YES), the CPU 62 updates the voltage to Vup in the memory 63 (S16).

The CPU 62 estimates SOC by current integration (S17), and ends the processing.

When the CPU 62 determines that the current is smaller than 0 and the state of the battery 3 is the discharge state (S13: NO), the CPU 62 determines whether or not the voltage is lower than V1 (S18). When the CPU 62 determines that the voltage is not lower than V1 (S18: NO), the processing proceeds to S21.

When the CPU 62 determines that the voltage is lower than V1 (S18: YES), the CPU 62 determines whether or not the acquired voltage is lower than the lower reference voltage Vlow that is previously stored in the memory 63 (S19).

When the CPU 62 determines that the voltage is not lower than the previous Vlow (S19: NO), the processing proceeds to S21.

When the CPU 62 determines that the voltage is lower than the previous Vup (S19: YES), the voltage is updated to Vlow in the memory 63 (S20).

The CPU 62 estimates SOC by current integration (S21) and ends the processing.

When the CPU 62 determines that the absolute value of the current is smaller than the pause threshold and the state of the battery 3 is the pause state (S12: NO), the CPU 62 determines whether or not a set time period has elapsed (S22). The set time period is a time period obtained by an experiment and is sufficient to regard the acquired voltage as OCV. The CPU 62 determines whether or not the time period has been exceeded, on the basis of a number of current acquisitions and an acquisition interval since the determination as the pause state. This enables the SOC to be estimated with higher accuracy in the pause state.

When the CPU 62 determines that the set time period has not elapsed (S22: NO), the CPU 62 estimates SOC by current integration (S23) and ends the processing.

When the CPU 62 determines that the set time period has elapsed (S22: YES), the acquired voltage can be regarded as OCV.

The CPU 62 acquires the most recent second energy storage amount characteristics from the table 63b (S24). Here, the second energy storage amount characteristics are charge SOC-OCV and discharge SOC-OCV of the battery 3. Note that, in a case where there is a period from the date of the last acquisition of the actual measured energy storage amount characteristics, it is preferable to correct the estimated second energy storage amount characteristics in consideration of a history from the acquisition to the present moment.

The CPU 62 calculates energy storage amount characteristics for voltage reference on the basis of the acquired second energy storage amount characteristics (S25). On the basis of charge SOC-OCV, discharge SOC-OCV, and Vup, the CPU 62 calculates charge SOC-OCV for voltage reference or discharge SOC-OCV for voltage reference. For example, in consideration of an oxidation amount and a reduction amount of reaction causing hysteresis, the CPU 62 uses the charge SOC-OCV, the discharge SOC-OCV, and the Vup, to calculate charge SOC-OCV for voltage reference or the discharge SOC-OCV for voltage reference. Vup can be corrected on the basis of the current Rcha.

The CPU 62 estimates SOC by reading SOC corresponding to the voltage acquired in S1, in the charge SOC-OCV for voltage reference or the discharge SOC-OCV for voltage reference (S26), and ends the processing.

Note that the voltage acquired by the CPU 62 from the voltage measuring unit 8 varies to an extent depending on the current, and therefore a correction coefficient can also be obtained by experiment to correct the voltage.

As described above, in the present embodiment, a plurality of energy storage amount-potential characteristics, energy storage amount-voltage characteristics, or pieces of V–dQ/dV that reflect VF due to deterioration of the single electrode are stored, and the first energy storage amount-voltage characteristics are calculated on the basis of the energy storage amount characteristics and the feature value. On the basis of the first energy storage amount-voltage characteristics and the actual measured energy storage amount-voltage characteristics acquired in a predetermined voltage range, the parameter is obtained by optimization calculation. With a simple method, it is possible to detect a state of the single electrode corresponding to VF, and a state of the counter electrode, with a parameter. Therefore, the current internal state of the battery 3 can be estimated with high accuracy.

The number of energy storage amount characteristics data to be stored in the table 63b can be reduced.

Even in a complicated use environment, an internal state can be monitored with high accuracy.

When the active material has hysteresis, the energy storage amount-voltage characteristics for voltage reference can be accurately estimated on the basis of the second energy storage amount-potential characteristics according to the current deterioration state of the single electrode and on the basis of the charge-discharge history of the energy storage device. By using together knowledge of a behavior of hysteresis for the energy storage device containing the active material having a high capacity and the VF property, an energy storage amount can be estimated relatively easily.

Since the voltage is used, it is possible to estimate a current energy amount stored in the energy storage device, such as watt-hour, as the energy storage amount, without limiting to SOC. On the basis of the charge-discharge characteristics, dischargeable energy up to SOC 0% and charge energy required up to SOC 100% can be predicted. Remaining watt-hour and storable watt-hour at the present moment can be estimated.

Therefore, it is possible to accurately perform: balancing in a case of using a plurality of energy storage devices; control of regenerative acceptance; estimation of a travel distance when the energy storage device is mounted on a vehicle; and the like.

The present invention is not limited to the contents of the embodiments described above, and various modifications can be made within the scope of the claims. That is, embodiments obtained by combining technical means appropriately changed within the scope of the claims are also included in the technical scope of the present invention.

In the first embodiment, description has been made on the case where the positive electrode contains the active material having VF and hysteresis. However, also in a case where the negative electrode contains the active material having VF and hysteresis, the energy storage amount-potential characteristics or V–dQ/dV can be similarly estimated.

The estimation of the energy storage amount by voltage reference according to the present invention is not limited to the case of being performed during a pause, and may be performed in real time at a time of charge or discharge. In this case, current OCV is calculated from the acquired voltage and current. The calculation of the OCV can be obtained by estimating a voltage when a current is zero, and the like, with use of a regression line from a plurality of voltage and current data. In addition, when the current is as small as dark current, the acquired voltage V can be read as OCV.

The estimation device and the energy storage amount estimation device according to the present invention are not limited to the case of being applied to an in-vehicle lithium ion secondary battery, and can also be applied to other energy storage apparatuses such as a railway regenerative power storing apparatus and a solar power generating system. In an energy storage apparatus in which a minute current flows, a voltage between the positive electrode terminal and the negative electrode terminal of the energy storage device can be regarded as OCV.

The energy storage device is not limited to a lithium ion secondary battery, and may be another secondary battery or an electrochemical cell having VF and hysteresis properties.

The case where the monitoring device 100 or the BMU 6 is the energy storage amount estimation device has been exemplified. Alternatively, a cell monitoring unit (CMU) may be the energy storage amount estimation device. The energy storage amount estimation device may be a part of an energy storage module incorporated with the monitoring device 100 or the like. The energy storage amount estimation device may be configured separately from the energy storage device and the energy storage module, and connected to the energy storage module including the energy storage device whose heat storage amount is to be estimated when a heat storage amount is estimated. The heat storage amount estimation device may remotely monitor the energy storage device and the energy storage module.

INDUSTRIAL APPLICABILITY

The present invention can be applied to estimation of an internal state of an energy storage device such as a lithium ion secondary battery.

DESCRIPTION OF REFERENCE SIGNS

1, 50: battery module (energy storage apparatus)
2: case
21: case body
22: lid
23: BMU housing
24: cover
25: inner lid
26: partition plate
3, 200: battery (energy storage device)
31: case
32: terminal
33: electrode assembly
4: bus bar
5: external terminal 6: BMU (estimation device)
60: information processing unit
62: CPU (acquisition unit, first estimation unit, second estimation unit, third estimation unit, fourth estimation unit, fifth estimation unit)
63: memory (storage unit)
63a: program
63b: table
7: current sensor
8: voltage measuring unit
9: current measuring unit
10: ECU
100: monitoring device (estimation device)
300: housing case

The invention claimed is:

1. An estimation device for estimating an internal state of an energy storage device including a first electrode containing an active material in which repeated charge-discharge changes a first characteristic that is an energy storage amount-potential charge characteristic of the first electrode, and a second characteristic that is an energy storage amount-potential discharge characteristic of the first electrode, the estimation device comprising:
an acquisition unit that acquires information relating to a part of a third characteristic that is an energy storage amount-voltage charge characteristic based on a voltage difference between the first electrode and a second electrode of the enemy storage device, and/or a fourth characteristic that is an energy storage amount-voltage discharge characteristic based on the voltage difference between the first electrode and the second electrode of the energy storage device;
a storage unit that stores a plurality of energy storage amount characteristics that are at least one of first characteristics, second characteristics, third characteristics, fourth characteristics, and V–dQ/dV, which is a relationship of V, as a potential of the first electrode or a voltage of the energy storage device, with a differential value of Q, as an amount of a charge or a discharge, in correspondence with a change in a feature value, which is changed by repeated charge-discharge, or stores as a function of the feature value, the feature value including at least one of an amount of a charge capacity or a discharge capacity, and an average discharge potential; and
a first estimation unit that estimates an internal state of the energy storage device in accordance with the information, and in accordance with the energy storage amount characteristics or the function.

2. The estimation device according to claim 1, wherein the acquisition unit acquires information of the third characteristic and/or the fourth characteristic in a predetermined voltage range of the energy storage device,
wherein the estimation device further comprises a second estimation unit that obtains the feature value from the information, and refers to the energy storage amount characteristics or the function in accordance with the feature value, to estimate the third characteristic or the fourth characteristic at a time when the information is acquired, and
wherein the first estimation unit estimates a parameter indicating an internal state of the energy storage device in accordance with the information and the estimated third characteristic or fourth characteristic.

3. The estimation device according to claim 2, wherein the feature value is at least one of an amount of the charge capacity or the discharge capacity in the predetermined voltage range, and an average discharge potential.

4. The estimation device according to claim 2, wherein the parameter is at least one kind selected from the first characteristic, the second characteristic, a ratio of the first characteristic, a degree of contraction of the first electrode, a degree of contraction of a counter electrode, a deviation amount of capacity balance between the first electrode and die counter electrode, and polarization, and
wherein the ratio of the first characteristic is expressed as:

(a ratio of a first characteristic)=(a difference in an energy storage amount between a first characteristic and a second characteristic at a potential of the first electrode corresponding to a maximum attainment voltage of the energy storage device stored in the storage unit when the information is acquired)/(a maximum value of the difference in the energy storage amount).

5. The estimation device according to claim 2, wherein the second estimation unit refers to the V–dQ/dV to estimate V–dQ/dV by an interpolation calculation, and
wherein the parameter includes a processing coefficient necessary for the interpolation calculation.

6. The estimation device according to claim 2, wherein the first estimation unit obtains the parameter by an optimization calculation to minimize a difference between the information and the third characteristic or the fourth characteristic estimated by the second estimation unit.

7. The estimation device according to claim 2, further comprising a third estimation unit that estimates the third characteristic or the fourth characteristic, using the parameter estimated by the first estimation unit.

8. The estimation device according to claim 7, wherein the active material causes two or more electrochemical reactions in accordance with transition of charge-discharge, and hysteresis between the third characteristic and the fourth characteristic exhibited when one electrochemical reaction occurs is smaller than the hysteresis when another electrochemical reaction occurs, and
wherein the estimation device further comprises a fourth estimation unit that estimates a third characteristic for reference or a fourth characteristic for reference when estimating an energy storage amount with an acquired voltage, in accordance with the third characteristic or the fourth characteristic estimated by the third estimation unit, and in accordance with a charge-discharge history of the energy storage device.

9. The estimation device according to claim 8, further comprising:
a fifth estimation unit that estimates an energy storage amount in accordance with the charge-discharge history, the third characteristic for the reference or the fourth characteristic for reference, and an acquired voltage.

10. An energy storage apparatus comprising:
an energy storage device; and
the estimation device according to claim 1.

11. An estimation method for estimating an internal state of an energy storage device including a first electrode containing an active material in which repeated charge-discharge changes a first characteristic that is an energy storage amount-potential charge characteristic of the first electrode, and a second characteristic that is an energy storage amount-potential discharge characteristic of the first electrode, the estimation method comprising:
storing, in a storage unit, a plurality of energy storage amount characteristics that are at least one of first characteristics, second characteristics, third characteristics that are energy storage amount-voltage charge characteristics based on a voltage difference between the first electrode and a second electrode of the energy storage device, fourth characteristics that are energy storage amount-voltage discharge characteristics based on the voltage difference between the first electrode and the second electrode of the energy storage device, and V–dQ/dV, which is a relationship of V, as a potential of the first electrode or a voltage of the energy storage device, with a differential value of Q, as an amount of a charge or a discharge, in correspondence with a change in a feature value, which is changed by repeated charge-discharge, or having stored as a function of the feature value, the feature value including at least one of an amount of a charge capacity or a discharge capacity in a predetermined voltage range, and an average discharge potential;

acquiring information relating to a part of the third characteristic and/or the fourth characteristic of the energy storage device; and estimating an internal state of the energy storage device in accordance with the information, and in accordance with the energy storage amount characteristics or the function.

12. A computer program for causing a computer that estimates an internal state of an energy storage device including a first electrode containing an active material in which repeated charge-discharge changes a first characteristic that is an energy storage amount-potential charge characteristic of the first electrode, and a second characteristic that is an energy storage amount-potential discharge characteristic of the first electrode, to execute processing of:

acquiring information relating to a part of a third characteristic that is an energy storage amount-voltage charge characteristic based on a voltage difference between the first electrode and a second electrode of the energy storage device and/or a fourth characteristic that is an energy storage amount-voltage discharge characteristic based, on the voltage difference between the first electrode and the second electrode of the energy storage device;

referring to a table that stores a plurality of energy storage amount characteristics that are at least one of first characteristics, second characteristics, third characteristics, fourth characteristics, and V–dQ/dV, which is a relationship of V, as a potential of the first electrode or a voltage of the energy storage device, with a differential value of Q, as an amount of a charge or a discharge, in correspondence with a change in a feature value, or referring to a function of the feature value, the feature value including at least one of an amount of a charge capacity or a discharge capacity in a predetermined voltage range, and an average discharge potential; and estimating an internal state of the energy storage device in accordance with the information, and in accordance with the energy storage amount characteristics or the function.

13. The estimation device according to claim 1, wherein a difference between the third characteristic and the fourth characteristic exhibits hysteresis.

14. The estimation device according to claim 1, wherein the first estimation unit estimates the internal state of the energy storage device in accordance with the energy storage amount characteristics.

15. The estimation device according to claim 1, wherein the first estimation unit estimates the internal state of the energy storage device in accordance with the function.

16. The estimation method according to claim 11, wherein a difference between the third characteristic and the fourth characteristic exhibits hysteresis.

17. The estimation method according to claim 11, wherein the estimating of the internal state of the energy storage device is performed in accordance with the energy storage amount characteristics.

18. The estimation method according to claim 11, wherein the estimating of the internal state of the energy storage device is performed in accordance with the function.

19. The computer program according to claim 12, wherein a difference between the third characteristic and the fourth characteristic exhibits hysteresis.

20. The computer program according to claim 12, wherein the estimating of the internal state of the energy storage device is performed in accordance with the energy storage amount characteristics.

* * * * *